United States Patent
Kobayashi

(10) Patent No.: US 8,003,918 B2
(45) Date of Patent: Aug. 23, 2011

(54) VERTICAL HEAT TREATMENT BOAT AND HEAT TREATMENT METHOD FOR SEMICONDUCTOR WAFER

(75) Inventor: Takeshi Kobayashi, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 189 days.

(21) Appl. No.: 12/449,629

(22) PCT Filed: Feb. 28, 2008

(86) PCT No.: PCT/JP2008/000384
§ 371 (c)(1),
(2), (4) Date: Aug. 18, 2009

(87) PCT Pub. No.: WO2008/111286
PCT Pub. Date: Sep. 18, 2008

(65) Prior Publication Data
US 2010/0015817 A1     Jan. 21, 2010

(30) Foreign Application Priority Data
Mar. 12, 2007   (JP) ................. 2007-061632

(51) Int. Cl.
*F27D 11/00* (2006.01)
*A21B 2/00* (2006.01)

(52) U.S. Cl. ........ 219/385; 219/390; 219/408; 219/411; 392/416; 392/418; 438/795; 432/253; 257/E21.49

(58) Field of Classification Search ............ 219/385, 219/390, 405, 411; 392/416, 418; 118/724–5, 118/728–30; 438/795; 432/253; 257/E21.49
See application file for complete search history.

(56) References Cited

U.S. PATENT DOCUMENTS
6,077,343 A    6/2000   Iida et al.

FOREIGN PATENT DOCUMENTS
| EP | 1 806 777 A1 | 7/2007 |
| JP | A-2000-053497 | 2/2000 |
| JP | A-2004-241545 | 8/2004 |
| JP | A-2005-159028 | 6/2005 |
| JP | A-2006-128316 | 5/2006 |

*Primary Examiner* — Shawntina Fuqua
(74) *Attorney, Agent, or Firm* — Oliff & Berridge, PLC

(57) ABSTRACT

The present invention provides a vertical heat treatment boat that has at least four or more support portions per processing target substrate to be supported, the support portions horizontally supporting the processing target substrate, support auxiliary members on which the processing target substrate is mounted being detachably attached to the four or more support portions, respectively, wherein flatness obtained from all surfaces of the respective support auxiliary members on which the processing target substrate is mounted is adjusted by adjusting thicknesses of the support auxiliary members or interposing spacers between the support portions and the support auxiliary members in accordance with respective shapes of the four or more support portions. As a result, it is provided the vertical heat treatment boat and a heat treatment method for a semiconductor wafer that can readily improve flatness in support of the processing target substrate and effectively prevent occurrence of slip dislocation when performing a heat treatment to the processing target substrate such as a semiconductor wafer by using a vertical heat treatment furnace.

4 Claims, 8 Drawing Sheets

(A)

(B)

(A)

(B)

(A)

(B)

VERTICAL HEAT TREATMENT BOAT AND HEAT TREATMENT METHOD FOR SEMICONDUCTOR WAFER

TECHNICAL FIELD

The present invention relates to a vertical heat treatment boat that is used when performing a heat treatment to a processing target substrate such as a semiconductor wafer and to a heat treatment method for a semiconductor wafer.

BACKGROUND ART

When using a semiconductor single crystal wafer, e.g., a silicon wafer to fabricate a device, many processes from a wafer machining process to a device forming process intervene, and one of such processes is a heat treatment process. The heat treatment process is an important process which is carried out for the purpose of, e.g., formation of a defect-free layer on a surface layer of a wafer, gettering, crystallization, formation of an oxide film, or diffusion of an impurity.

As a diffusion furnace (an oxidation/diffusion apparatus) that is used for such a heat treatment process, e.g., oxidation or impurity diffusion, a vertical heat treatment furnace in which a heat treatment is carried out in a state where many wafers are horizontally held at predetermined intervals is mainly used with an increase in diameter of wafers. Further, when performing a heat treatment to the wafers by using the vertical heat treatment furnace, a vertical heat treatment boat (which will be referred to as a "heat treatment boat" or simply referred to as a "boat" hereinafter) that is required to set many wafers is utilized.

FIG. 8 shows an outline of a conventional general vertical heat treatment boat 210. A pair of plate-like members (which will be also referred to as coupling members or a top plate and a bottom plate) 216 are coupled with both end portions of each of four supports (rods) 214. Many grooves 211 are formed on each support 214, and a convex portion between the respective grooves 211 functions as a support portion 212 for a wafer. When performing a heat treatment to each wafer, as shown in a plan view of FIG. 9(A) and a front view of FIG. 9(B), each wafer W is horizontally supported by mounting an outer peripheral portion of the wafer W on the support portions 212 formed at the same height of each support 214.

FIG. 10 is a schematic view showing an example of a vertical heat treatment furnace. Many wafers W are horizontally supported on a heat treatment boat 210 installed in a reaction chamber 222 of a vertical heat treatment furnace 220. At the time of a heat treatment, each wafer W is heated by a heater 224 provided around the reaction chamber 222. During the heat treatment, a gas is introduced into the reaction chamber 222 through a gas introduction tube 226 to flow downwardly from an upper side and discharged toward the outside from a gas exhaust tube 228. Although the gas to be used differs depending on a purpose of the heat treatment, $H_2$, $N_2$, $O_2$, Ar, or the like is mainly used. In case of impurity diffusion, each of these gases is used as a carrier gas for an impurity compound gas.

Various kinds of shapes are adopted for the wafer support portion 212 in the vertical heat treatment boat 210, and each of FIGS. 11(A) and (B) shows an example. In (A), concave grooves 211 are provided on the support 214 having a semi-cylindrical shape to form semicircular support portions 212. On the other hand, in (B), concave grooves 211 are provided on a wide prismatic support 215 to form rectangular support portions 213 in order to support each wafer W at a position closer to the center thereof than (A). Besides, a groove shape may be an arched shape or a hook-like shape.

Furthermore, a structure where relatively large plate-like support portions (support plates) are provided on each support to support each wafer in a stable state (see Japanese Unexamined Patent Publication (Kokai) No. 2000-53497) or a structure where a step is provided on an upper surface of each support portion to enable supporting wafers having different diameters (see Japanese Unexamined Patent Publication (Kokai) No. 2005-159028) is also suggested.

In regard to a material of the boat, a material such as quartz ($SiO_2$), a silicon carbide (SiC), or silicon (Si) is usually utilized for, e.g., a silicon wafer in order to avoid contamination of wafers. For example, in a heat treatment process at a high temperature exceeding 1000° C., an SiC or Si boat having higher heat resistance than a quartz ($SiO_2$) boat is used. In particular, the SiC boat is often used since metal contamination that occurs during a heat treatment can be more reduced when the SiC boat is subjected to CVD-SiC coating.

Meanwhile, in case of using the vertical heat treatment boat, internal stress due to a weight of the wafer itself, thermal strain stress due to non-uniformity of an in-wafer temperature distribution or the like occurs when a high-temperature heat treatment is performed for the purpose of oxidation, impurity diffusion or the like in particular, and slip (slip dislocation) as a crystal defect occurs in the wafer when such stress exceeds a given fixed critical value. Since the critical value for occurrence of the dislocation is precipitously reduced when a temperature rises, it is known that the slip dislocation is apt to occur as a temperature increases. When a device is formed at a position where the slip dislocation occurs, which may be a factor of, e.g., junction leakage, thereby a yield ratio of fabrication of a device considerably decreases in some cases.

It is known that occurrence of this slip dislocation becomes harder to be suppressed when a diameter of the wafer is increased. When a wafer load rises due to an increase in diameter and, for example, three-point support that three support portions support the wafer is adopted, the wafer load is apt to be concentrated on one of the three support portions, and the slip dislocation readily occurs. Thus, since the wafer load must be distributed to suppress occurrence of the slip dislocation, a vertical heat treatment boat in which four or more support portions are provided as shown in FIGS. 8 and 9 in place of the three-point support to enable support at four or more points is utilized.

DISCLOSURE OF THE INVENTION

However, even when a boat adopting support by four or more points is utilized to support a boat for the purpose of distributing a wafer load as explained above and a heat treatment is carried out, the slip dislocation occurs.

The present inventor has discovered that flatness provided by the later-explained four or more support portions is apt to be degraded due to an increase in number of the support portions, the load is thereby unbalanced, and hence the slip dislocation readily occurs.

Additionally, machining the SiC boat or the like is difficult, and it is very difficult to highly accurately perform machining to precisely uniform heights of the support portions in such a manner that the flatness provided by all the four or more support portions can be improved by machining of the boat itself. In particular, in case of such a long finger boat having a long length of each support portion as shown in FIG. 11(B), machining is extremely difficult.

Here, the flatness will now be explained in detail. The flatness used here can be calculated, e.g., by using a measurement result of a shape of the support portion measured by a three-dimensional measuring instrument or the like as follows.

First, FIG. 4 shows an outline of a method for measuring a shape of the support portion by using the three-dimensional measuring instrument.

This three-dimensional measuring instrument 21 includes an arm 22 having portions A, B, C that can respectively move in X, Y, and Z directions, a probe 23 placed at a distal end of the arm 22, and a stone table 24 on which a measurement target object (the vertical heat treatment boat) is mounted. The probe 23 can be rotated, and a ruby ball is placed at a distal end of the probe 23.

Further, when performing measurement, the arm 22 or the probe 23 is used to adjust a position, and the ruby ball of the probe 23 is pressed against each support portion of the vertical heat treatment boat, thereby obtaining a Z coordinate at each measurement position. The measurement position can be appropriately set in accordance with, e.g., a length or a size of each support portion, and it is not restricted in particular, but two measurement positions can be set in accordance with each support portion and a total of eight measurement positions can be provided when the number of the support portions supporting one processing target substrate is four, for example (see FIG. 1(B)). It is to be noted that a reference (a reference surface) of the Z coordinate can be set to, e.g., an upper surface of the stone table 24 (a back surface of the bottom plate of the vertical heat treatment boat).

In the thus obtained Z coordinates at the respective measurement positions, a displacement from the lowest point (i.e., a Z coordinate at the measurement position closest to the reference surface) to each point (a Z coordinate at each measurement position) is obtained. Furthermore, a least square plane of the eight points is calculated from the obtained displacement data, and a distance from the least square plane to the farthest point in the eight points is defined as the flatness.

In view of the problems arising from unbalance of a load in a situation where four or more support portions are provided, it is an object of the present invention to provide a vertical heat treatment boat and a heat treatment method for a semiconductor wafer that can readily improve flatness in support of a processing target substrate and effectively prevent occurrence of slip dislocation when performing a heat treatment to the processing target substrate such as a semiconductor wafer in a vertical heat treatment furnace.

To achieve this object, the present invention provides a vertical heat treatment boat that has at least four or more support portions per processing target substrate to be supported, the support portions horizontally supporting the processing target substrate, support auxiliary members on which the processing target substrate is mounted being detachably attached to the four or more support portions, respectively, wherein flatness obtained from all surfaces of the respective support auxiliary members on which the processing target substrate is mounted is adjusted by adjusting thicknesses of the support auxiliary members or interposing spacers between the support portions and the support auxiliary members in accordance with respective shapes of the four or more support portions.

When such a vertical heat treatment boat is provided, since the flatness obtained from all surfaces of the respective support auxiliary members on which the processing target substrate is mounted is adjusted, a load applied to the respective support auxiliary members on which the processing target substrate is mounted becomes uniform to prevent unbalance of the load, and occurrence of slip dislocation can be also effectively suppressed.

Further, since adjustment of the flatness is performed by adjusting thicknesses of support auxiliary members or interposing the spacers between the support portions and the support auxiliary members in accordance with a shape of each of the four or more support portions that support each processing target substrate, the flatness can be very easily adjusted. That is, the flatness is not adjusted by an unfeasible method for highly accurately machining the boat itself, but it is adjusted by thicknesses of the support auxiliary members or the spacers which can be finely adjusted, thereby readily and accurately adjusting the flatness.

At this time, it is desirable that the vertical heat treatment boat has four or more supports and a pair of plate-like members coupled with both end portions of each support, the plurality of support portions are formed on each support in a vertical direction by forming a plurality of grooves in a horizontal direction, and each processing target substrate is inserted into each groove and supported by the four or more support portions.

When the thus configured vertical heat treatment boat is provided, since each processing target substrate can be inserted into each groove and supported by the four or more support portions and the plurality of processing target substrates can be supported at one time, the plurality of processing target substrates can be simultaneously efficiently subjected to a heat treatment with a high quality.

Furthermore, the present invention provides a heat treatment method for a semiconductor wafer, the method including, at least, when horizontally supporting each semiconductor wafer by four or more support portions and performing a heat treatment, detachably attaching respective support auxiliary members to the four or more support portions, and mounting the semiconductor wafer on the support auxiliary members to be subjected to the heat treatment, wherein respective shapes of the four or more support portions are measured to obtain flatness provided by all the four or more support portions from the measurement, based on the obtained flatness, thicknesses of the support auxiliary members are adjusted, the support auxiliary members having the adjusted thicknesses are selected in accordance with the measured shapes of the respective support portions, and the selected support auxiliary members are attached to the support portions, or spacers are selected in accordance with the measured shapes of the respective support portions, and the support auxiliary members are attached to the support portions to sandwich the selected spacers, and the flatness provided by all mounting surfaces of the respective support auxiliary members is adjusted, and then the semiconductor wafer is mounted on the mounting surfaces to be subjected to the heat treatment.

As explained above, in the heat treatment method for a semiconductor wafer according to the present invention, since the flatness obtained by all mounting surfaces of the respective support auxiliary members is adjusted and then the semiconductor wafer is mounted on the mounting surfaces to be subjected to a heat treatment, the semiconductor wafer can be mounted so as to uniformly apply a load thereof to the respective support auxiliary members, and the heat treatment can be performed. Therefore, as different from the conventional example, unbalance of the wafer load can be prevented from occurring, and slip dislocation caused by this unbalance can be effectively suppressed.

Moreover, the adjustment of the flatness is performed by measuring a shape of each of the four or more support portions supporting each semiconductor wafer to obtain the flatness provided by all the four or more support portions from the measurement, based on the obtained flatness, adjusting a thicknesses of support auxiliary members, selecting support auxiliary members having the adjusted thicknesses in accordance with the measured shapes of the respective support portions, and attaching the selected support auxiliary members to the support portions, or selecting spacers in accordance with the measured shapes of the support portions to attach the support auxiliary members to the support portions to sandwich the selected spacers, thereby very easily adjusting the flatness. A difficult method of highly accurately machining the boat itself is not used, but the thickness of the support auxiliary member or the spacer which can be easily finely adjusted is selected to adjust the flatness, thus simply and accurately adjusting the flatness.

At this time, it is desirable that the heat treatment is performed by using a vertical heat treatment boat which has four or more supports and a pair of plate-like members coupled with both end portions of each support and in which the plurality of support portions are formed on each support in a vertical direction by forming a plurality of grooves in a horizontal direction and each semiconductor wafer is inserted into each groove and supported by the four or more support portions.

When the method of using the thus configured vertical heat treatment boat to perform a heat treatment is utilized, each semiconductor wafer is inserted into each groove and supported by the four or more support portions, and the plurality of semiconductor wafers can be supported at a time, thereby simultaneously efficiently subjecting the plurality of semiconductor wafers to a heat treatment with a high quality.

As explained above, based on the vertical heat treatment boat and the semiconductor wafer heat treatment method according to the present invention, when supporting (mounting) the processing target substrate, e.g., a semiconductor wafer, the flatness obtained from all surfaces of the respective support auxiliary members on which this substrate is mounted can be adjusted, the processing target substrate can be supported in a balanced manner to be subjected to a heat treatment, and slip dislocation caused due to unbalance of a substrate load can be suppressed even though a diameter is increased. Additionally, since the flatness can be adjusted by adjusting the thickness of each support auxiliary member or each spacer, the flatness can be highly accurately and easily adjusted.

BEST MODES FOR CARRYING OUT THE INVENTION

Figure 1:
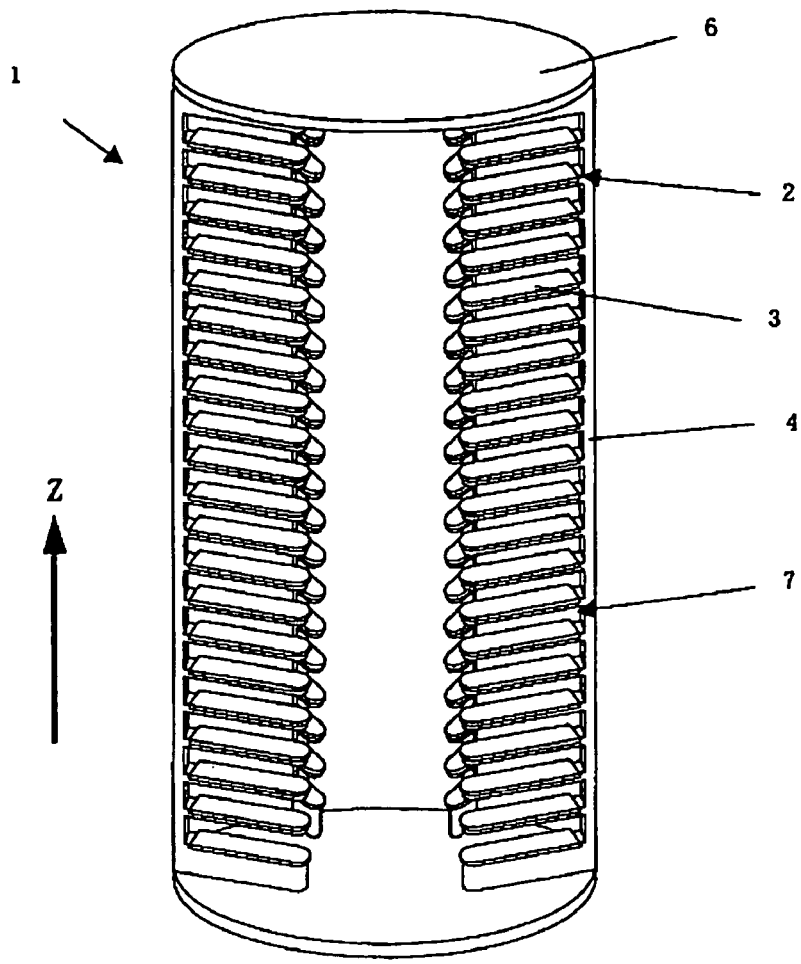
FIG. 1(A) is a schematic view showing an example of an entire vertical heat treatment boat according to the present invention.
FIG. 1(B) is a plan view showing an example of support portions of a boat main body.
Figure 1:
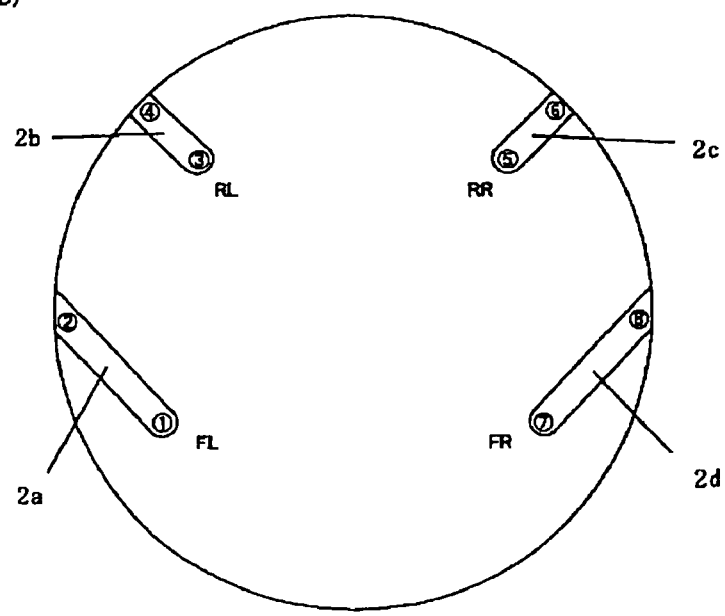

An embodiment according to the present invention will now be described hereinafter, but the present invention is not restricted thereto.

As explained above, for a vertical heat treatment boat, in a case of the one adopting a three-point support, a load is concentrated on one support portion and slip dislocation is apt to occur. Although the one adopting support by four or more support portions is used to improve this problem, a load distribution effect is not demonstrated and the slip dislocation occurs due to unbalance of the load caused by degradation in flatness. Further, highly accurately machining the boat itself is difficult, and improving the flatness is not easy.

Thus, the present inventor has found the following matters as a result of keenly conducting studies to uniform this load.

That is, a shape of each of four or more support portions supporting a processing target substrate is first measured. Then, a thickness of each support auxiliary member on which the processing target substrate is to be actually mounted is adjusted, or a spacer is interposed between each support auxiliary member and each support portion, in accordance with the measured shape of each support portion. Consequently, when the flatness provided by all mounting surfaces of the respective support auxiliary members is adjusted and then the processing target substrate is mounted to be subjected to a heat treatment, the flatness can be readily and accurately adjusted, the flatness can be improved to eliminate unbalance of the load of the processing target substrate, and occurrence of slip dislocation can be suppressed. The present inventors has discovered these matters and brought the present invention to completion.

Although the vertical heat treatment boat according to the present invention will now be described hereinafter in detail with reference to the drawings, the present invention is not restricted thereto. For example, a case where the number of supports is four, i.e., the number of support portions that support each processing target substrate is four in the vertical heat treatment boat will be explained, but the number of support portions may be five or more.

FIG. 1(A) shows an outline of an example of the entire vertical heat treatment boat according to the present invention. First, this heat treatment boat 1 has four supports 4 and a pair of plate-like members 6 (a top plate and a bottom plate) coupled with both end portions of each support 4. A plurality of grooves 7 are formed on each support 4 in a horizontal direction at equal intervals, and a plurality of convex supported portions 2 of a processing target substrate (a semiconductor wafer in this example) are formed between the respective grooves 7. Further, in the vertical heat treatment boat 1 according to the present invention, a support auxiliary member 3 is detachably attached to each support portion 2 of each support 4. When performing a heat treatment to a wafer, each wafer is mounted on each support auxiliary member 3 that is inserted from each groove 7 and attached to the support portion 2 formed at substantially the same height of each support 4.

As a result, the boat has a structure in which the plurality of wafers can be supported in a vertical direction at one time and subjected to a heat treatment, thereby efficiently subjecting the plurality of wafers to the heat treatment. The number of the grooves 7 (the number of the support portions 2) is not restricted in particular, and this number can be determined each time based on, e.g., a size of a heat treatment furnace into which the boat 1 is put.

The boat main body including the supports 4, the plate-like members 6, and the support portions 2 will be first described. This boat main body can be the same as that in the conventional example. That is, like the conventional example, the support 4 consisting of, e.g., SiC can be bonded to the plate-like members 6, and then each support is machined to form the plurality of the grooves 7 in the horizontal direction, thereby forming each portion, e.g., the support portion 2. Of course, the material is not restricted to SiC, and the one made of Si or $SiO_2$ can be applicable.

Figure 4:
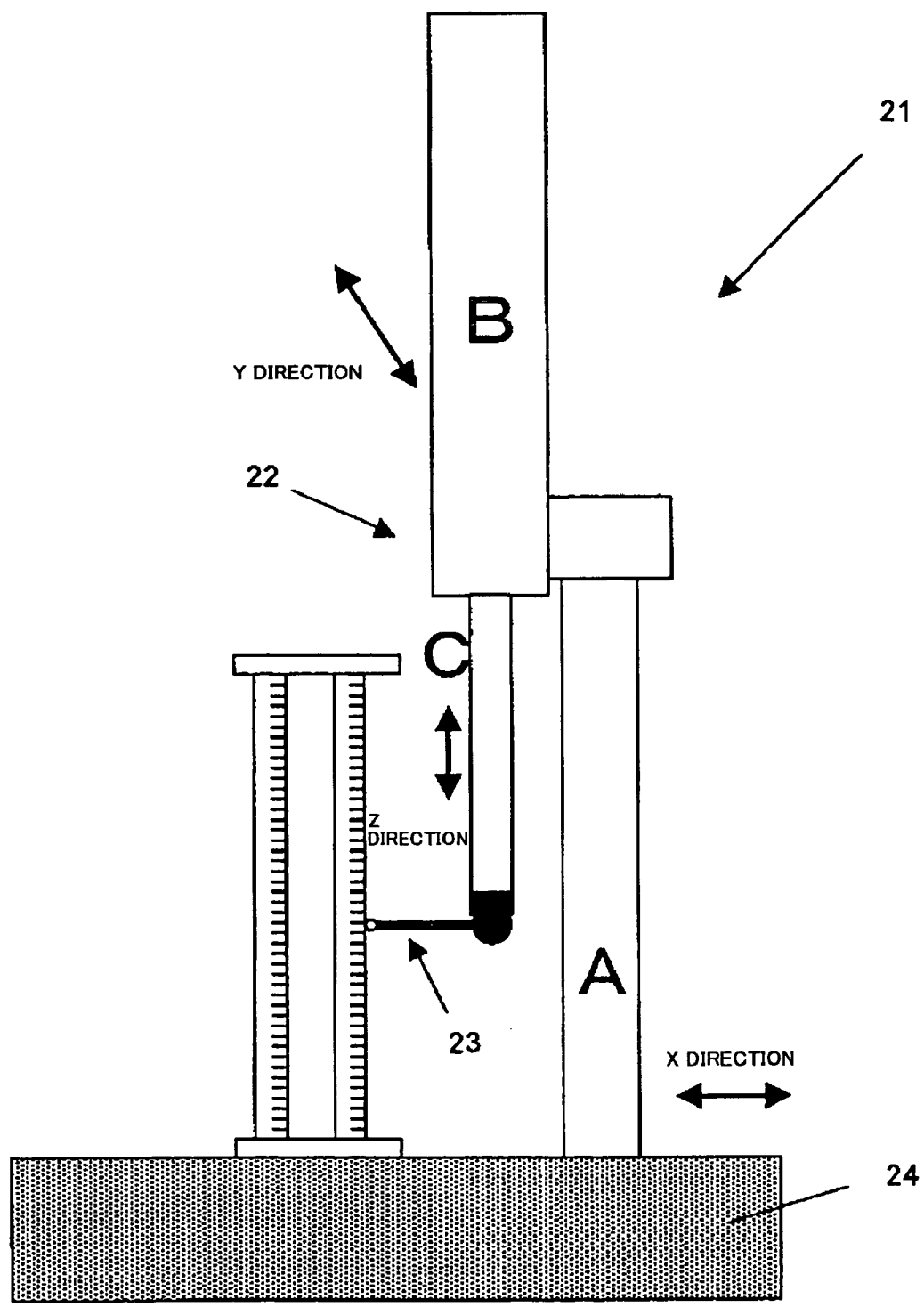
FIG. 4 is an explanatory view showing an example of a method for measuring a shape of the support portion by using a three-dimensional measuring instrument.

However, as explained above, performing high accurate machining is difficult in a conventional machining technology, and hence various Z coordinates (for example, a height from a reference which is a back surface of the bottom plate of the vertical heat treatment boat 1) are provided at respective measurement positions when such a three-dimensional measuring instrument as depicted in FIG. 4 is used to measure a shape of each support portion 2 in this boat main body. That is, although FIG. 1(B) is a plan view showing a pair of support portions 2 that support the same single wafer in a state where the support auxiliary members 3 are removed (i.e., the boat main body) in the boat overall view of FIG. 1(A), a total of eight measurement positions of the four support portions 2a(FL), 2b(RL), 2c(RR), and 2d(FR) depicted in the drawing have various heights. Further, in a case where flatness provided by all upper surfaces (support surfaces) of the support portions 2a to 2d obtained from data of these heights takes a relatively large value, since the support portions 2a to 2d have a large difference in relative positions (heights), a load is unbalanced and a wafer load is not uniformly distributed to the respective support portions 2a to 2d when the wafer is supported in such a conventional boat main body alone, and slip dislocation thereby occurs at the time of a heat treatment.

Figure 2:
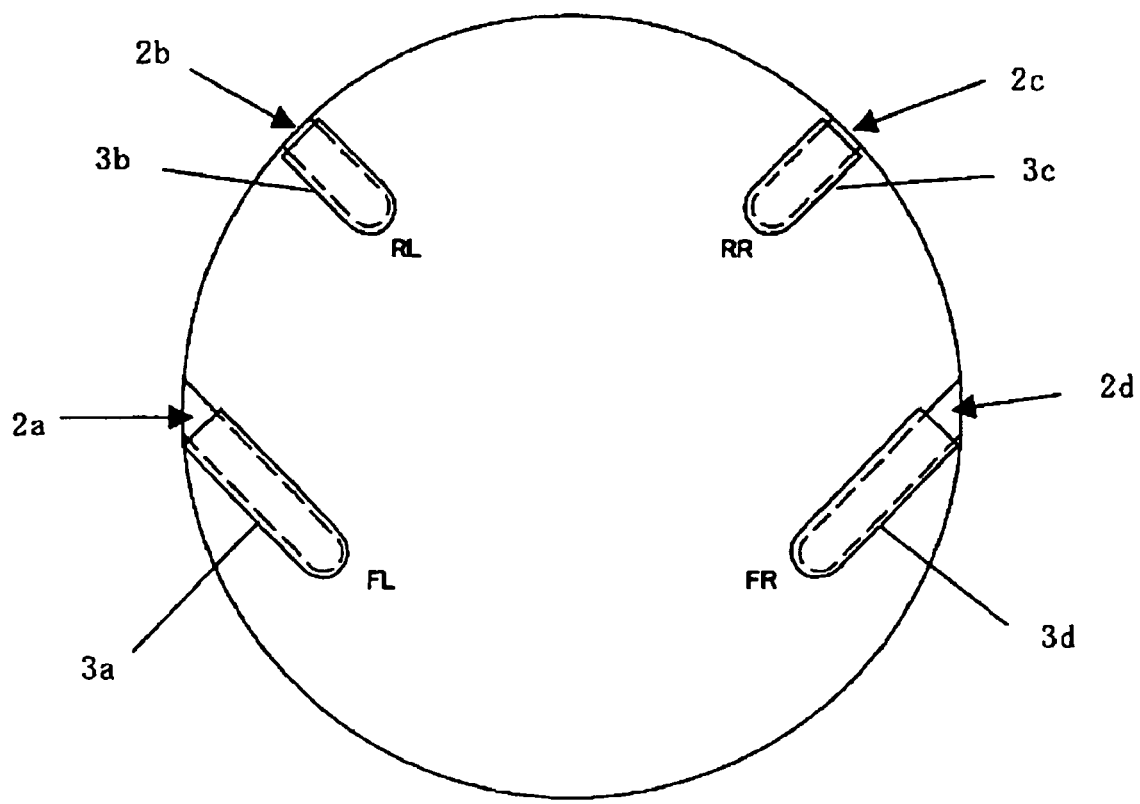
FIG. 2 is a plan view showing an example of a state where support auxiliary members are attached to the support portions.

On the other hand, in the vertical heat treatment boat 1 according to the present invention, support auxiliary members 3a, 3b, 3c, and 3d respectively adjusted to have an appropriate thickness are attached to the support portions 2a to 2d of the boat main body based on a shape measurement result of the support portions 2a to 2d. FIG. 2 is a plan view when the support auxiliary members 3a to 3d are attached to the support portions 2a to 2d, and FIG. 3(A) is a cross-sectional view showing an example of a state where the support auxiliary members 3a to 3d are attached to the support portions 2a to 2d.

Further, as shown in a cross-sectional view of FIG. 3(B), appropriate spacers 12 (12a, 12b, 12c, and 12d) can be interposed between the support portions 2a to 2d and the support auxiliary members 3e.

Furthermore, respective relative positions of surfaces on which the wafer W is actually mounted (mounting surfaces 30, i.e., upper surfaces of the respective support auxiliary members 3a to 3d and 3e) are adjusted by the support auxiliary members 3a to 3d each having an adjusted thickness or the spacers 12a to 12d, and the flatness obtained from all the mounting surfaces 30 is thereby adjusted. The adjustment of the support auxiliary members 3a to 3d or the spacers 12a to 12d is very easier than the machining of the boat itself, and it can be highly accurately performed. Therefore, the boat 1 having the attached support auxiliary members has the efficiently adjusted flatness for mounting the wafer, and slip dislocation can be effectively suppressed when this boat is used to perform a heat treatment, thus producing a high-quality heat-treated wafer.

Figure 3:
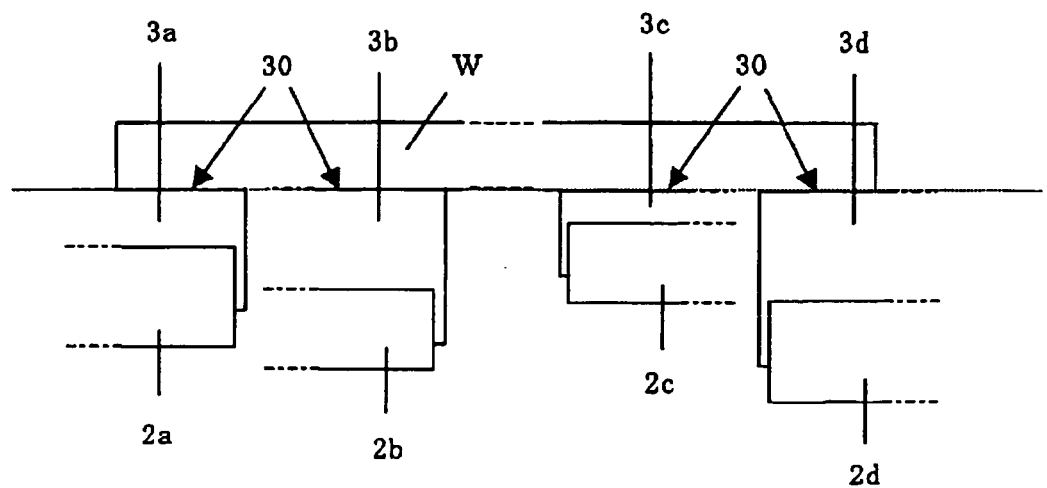
FIG. 3(A) is a cross-sectional view showing an example of a state where the support auxiliary members are attached to the support portions.
FIG. 3(B) is a cross-sectional view showing an example of a state where a spacer is interposed between each support portion and each support auxiliary member.
Figure 3:
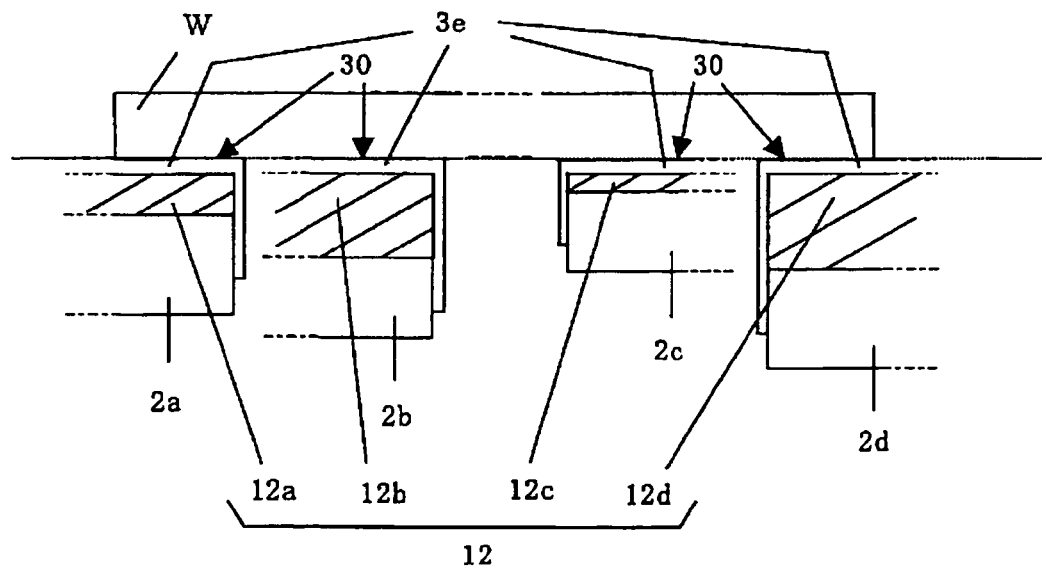

It is to be noted that FIG. 3 shows an example where heights of the mounting surfaces of all the support auxiliary members are the same, but the present invention is not restricted thereto, and the heights can be adjusted by appropriately adjusting relative positions in accordance with various conditions so that desired flatness can be obtained.

Moreover, performing the adjustment to obtain the desired flatness can suffice, and the thickness adjustment or the interposition of the spacers may be carried out with respect to all or some of the support auxiliary members.

A semiconductor wafer heat treatment method according to the present invention will now be described. The method according to the present invention can be carried out by using, e.g., the above-described vertical heat treatment boat (FIGS. 1 to 3) according to the present invention. Of course, any other boat can be likewise utilized, and a boat that enables carrying out the later-described method can suffice. It is to be noted that the number of the support portions 2 that support the single semiconductor wafer 1 or the like is not restricted in particular as long as it is four or above like the above-explained one. Here, an example where the four support portions are provided will be described.

First, as explained above, the three-dimensional measuring instrument 21 depicted in FIG. 4 is used to measure a shape of each of the support portions 2a to 2d. That is, Z coordinates at, e.g., a total of eight measurement positions of the respective support portions 2a to 2d are measured.

Here, in the obtained respective Z coordinates, for example, when the eighth measurement position has the lowest value, this lowest value is determined as a reference, and displacements to values at the respective measurement positions are calculated. Then, a least square plane S is calculated from the obtained displacement data to acquire flatness L that is a distance from this plane to the farthest point.

Subsequently, the support auxiliary members 3a to 3d each having an adjusted thickness are selected in accordance with the shapes of the respective support portions 2a to 2d obtained by the measurement, and these members are attached to the support portions 2a to 2d, respectively.

More specifically, if adjusting the flatness to a value smaller than the value L obtained as explained above (i.e., improving the flatness) is desired, members having thicknesses thicker than those of the support auxiliary members 3a and 3c attached to the support portions 2a and 2c having the high Z coordinates can be selected and attached as the support auxiliary members 3b and 3d with respect to the support portions 2b and 2d having the low Z coordinate when the shapes of the respective support portions 2a to 2d are as shown in FIG. 3 (see FIG. 3(A)).

As a result, relative positions (heights) of the mounting surfaces of the respective support auxiliary members 3a to 3d can be narrowed, whereby the flatness can be small compared to L.

It is to be noted that how to select the support auxiliary members 3a to 3d is not restricted to the above-explained method when adjusting the flatness, and these members can be appropriately determined based on data at the respective measurement positions (the shapes of the support portions 2a to 2d). It is good enough to adjust the thicknesses of the support auxiliary members each time and appropriately select and attach the support auxiliary members 3a to 3d so that the desired flatness can be obtained after the adjustment.

Additionally, the adjustment of the flatness can be performed by not only using the method based on the adjustment of the thicknesses of the support auxiliary members 3 but also by selecting and interposing the appropriate spacers 12 between the support auxiliary members 3 and the support portions 2.

For example, when the spacers 12a to 12d having appropriate thicknesses in accordance with the shapes of the support portions 2a to 2d are interposed between the support auxiliary members 3e and the support portions 2a to 2d and the support auxiliary members 3e are attached, the wafer mounting surfaces of the respective support auxiliary members 3e can be appropriately adjusted and the desired flatness can be obtained by the adjustment even if the relative positions or the like of the upper surfaces of the support portions 2a to 2d deviate and the support auxiliary members 3e attached to the respective support portions have the same thickness (see FIG. 3(B)).

Further, in the heat treatment method according to the present invention, the flatness provided by all the mounting surfaces of the support auxiliary members 3 is adjusted as above, and then the semiconductor wafer is mounted on the mounting surfaces to perform a heat treatment. Therefore, unbalance of a wafer load does not occur, and slip dislocation can be effectively suppressed. Furthermore, since the flatness is adjusted based on the thickness adjustment of the support auxiliary members 3 or the adjustment using the spacers 12, the fine adjustment is very easy and the adjustment can be highly accurately carried out at a low cost as different from an unfeasible method for highly accurately machining the boat itself.

It is to be noted that the vertical heat treatment boat 1 according to the present invention can be used to perform a heat treatment as explained above, and hence a plurality of semiconductor wafers can be mounted at one time and a heat treatment can be effected in this state, thereby efficiently producing a large quantity of high-quality heat-treated wafers.

The present invention will now be explained in more detail based on examples and comparative examples, but the present invention is not restricted thereto.

Example

To perform a heat treatment with respect to a silicon wafer having a diameter of 300 mm, a long finger boat main body adopting the four-point support like as the conventional example was prepared.

Here, such a three-dimensional measuring instrument (Crystal-Apex C manufactured by Mitutoyo) as shown in FIG. 4 was first used to measure heights (Z coordinates) of support portions 2a to 2d from a reference surface (an upper surface of a stone table 24). Measurement positions were a total of eight points as shown in FIG. 1(B). Further, displacements from the lowest point in the measurement to the respective points were obtained, whereby displacement data shown in FIG. 5 and Table 1 (items of the long finger boat itself) was obtained. It is to be noted that the seventh measurement position (a distal end side of the support portion 2d) had the lowest height, and hence this position was determined as a reference in FIG. 5 and Table 1. Respective units are μm.

A least square plane of the eight points was calculated from this displacement data, and flatness 60 μm was thereby obtained.

Figure 5:
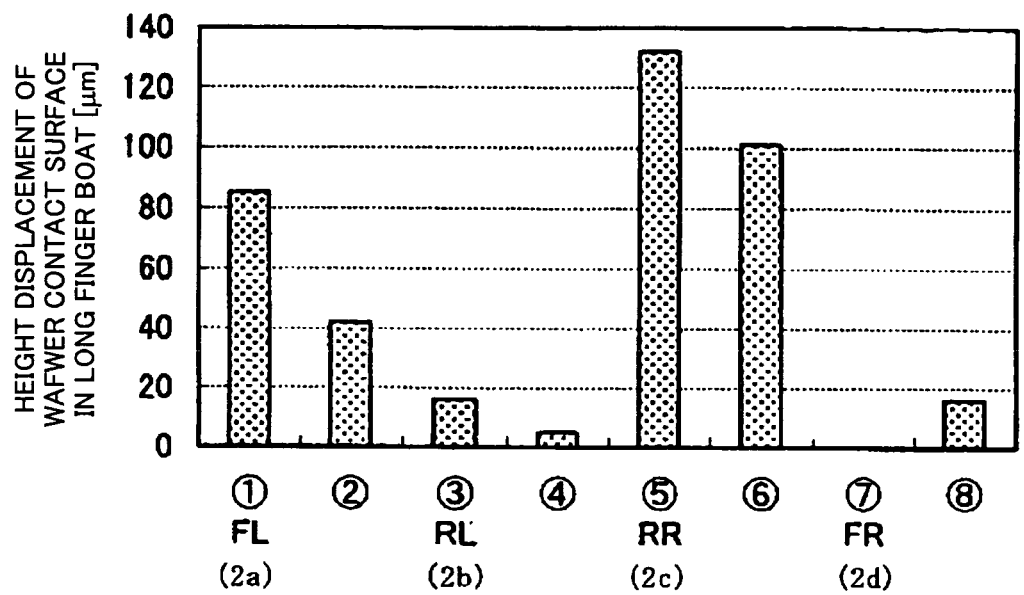
FIG. 5 shows displacement data indicative of relative heights of the support members in measurement of a shape of each support portion according to Example.

Here, to improve this flatness of 60 μm, support auxiliary members 3a to 3d which have different thickness respectively were selected and attached to the support portions 2a to 2d based on the data in FIG. 5 and Table 1.

Specifically, the support auxiliary member 3a having a thickness of 0.98 mm was attached to the support portion 2a, the support auxiliary member 3b having a thickness of 1.00 mm was attached to the support portion 2b, the support auxiliary member 3c having a thickness of 0.96 mm was attached to the support portion 2c, and the support auxiliary member 3d having a thickness of 1.00 mm was attached to the support portion 2d.

In this manner, the support auxiliary member 3c having the thinnest thickness was attached to the support portion 2c having the highest Z coordinate, and then the support auxiliary member 3a having the second thinnest thickness was attached to the support portion 2a having the second highest Z coordinate.

Further, the support auxiliary members 3b and 3d having the thicknesses relatively thicker than those of 3a and 3c were attached to the support portions 2b and 2d having the Z coordinates lower than those explained above, respectively.

The flatness was able to be reduced from 60 μm to 44 μm as shown in Table 1 by selecting and attaching the support auxiliary members having the appropriate thicknesses in accordance with shapes of the respective support portions in this manner. That is, it was possible that a load of a wafer was applied to respective mounting surfaces of these support auxiliary members in a well balanced manner. Furthermore, in regard to other grooves (support portions), silicon wafers were mounted so as to avoid occurrence of unbalance of loads, and annealing was performed at 1200° C. for one hour. That is, such a vertical heat treatment boat 1 according to the present invention as shown in FIG. 1 was used to carry out the heat treatment method according to the present invention.

Figure 6:
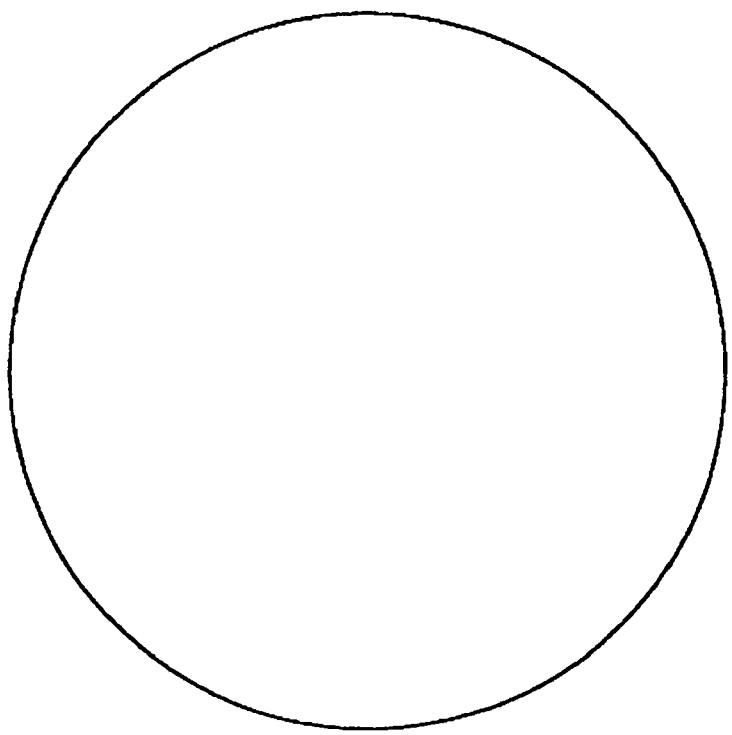
FIG. 6 shows an example of a measurement result of slip dislocation of a silicon wafer after a heat treatment according to Example.

As a result, like a measurement result of slip dislocation of a heat-treated silicon wafer shown in FIG. 6, no slip occurred in all silicon wafers, and high-quality heat-treated wafers were obtained.

TABLE 1

| | 2a (FL) | | 2b (RL) | | 2c (RR) | | 2d (FR) | | |
|---|---|---|---|---|---|---|---|---|---|
| | ① | ② | ③ | ④ | ⑤ | ⑥ | ⑦ | ⑧ | Flatness |
| Long finger boat itself | 85 | 42 | 16 | 5 | 132 | 101 | 0 | 16 | 60 |
| Example | 65 | 22 | 16 | 5 | 92 | 61 | 0 | 16 | 44 |
| Comparative Example 1 | 85 | 42 | 16 | 5 | 132 | 101 | 0 | 16 | 60 |
| Comparative Example 2 Reference Example | 85 | 42 | 16 | 5 | 142 | 111 | 0 | 16 | 63 |

Units are all μm

Comparative Example 1

The long finger boat main body that was first prepared in Example, i.e., the same four-point support boat as that in the conventional example was used, a silicon wafer having a diameter of 300 mm was mounted on support portions as it was, and annealing was carried out at 1200° C. for one hour like Example.

Figure 7:
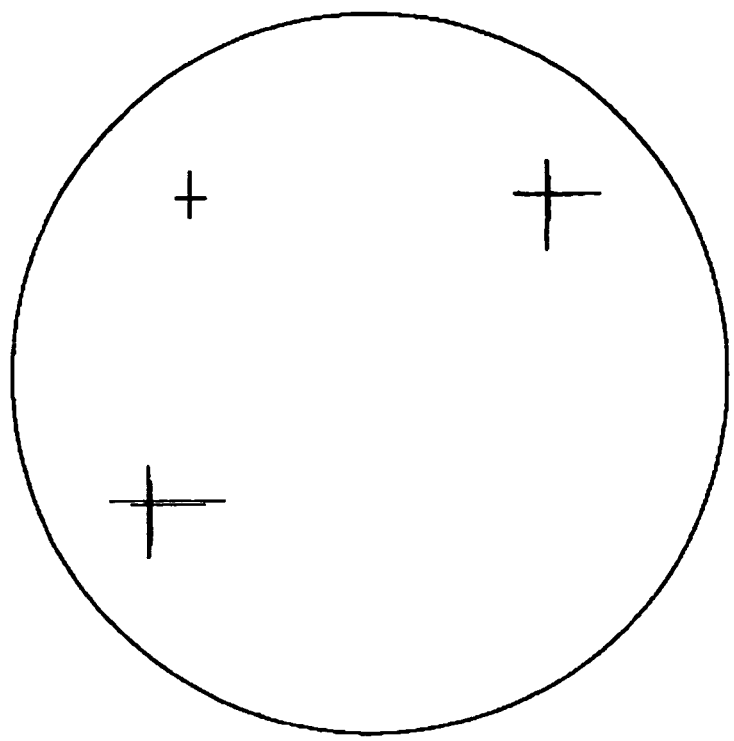
FIG. 7 is shows an example of a measurement result of slip dislocation of a silicon wafer after a heat treatment according to Comparative Example 1.
Figure 8:
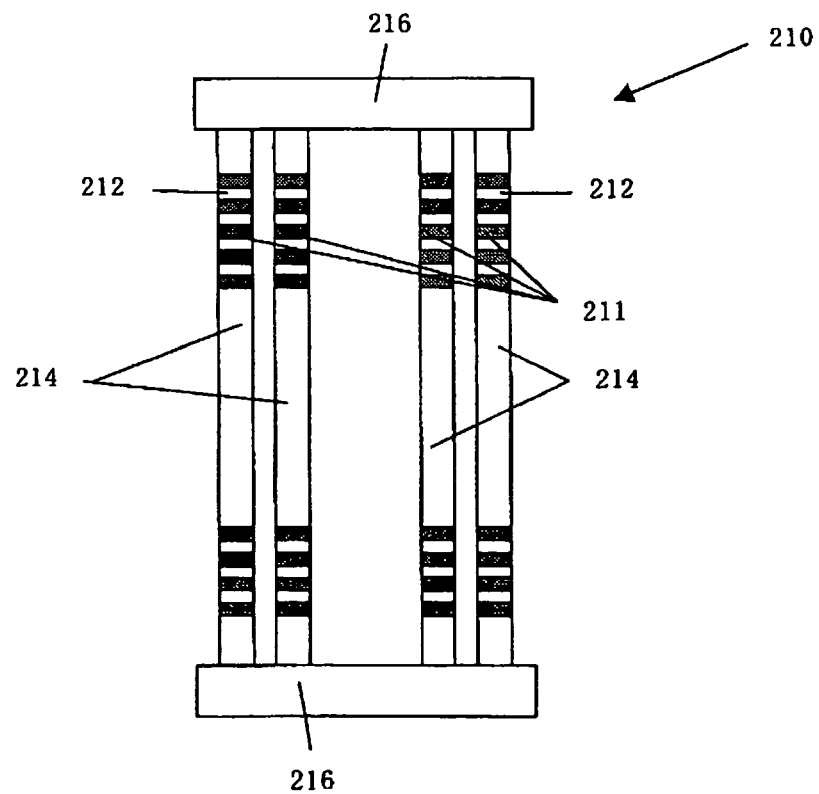
FIG. 8 is a schematic view showing an example of a conventional vertical heat treatment boat.
Figure 9:
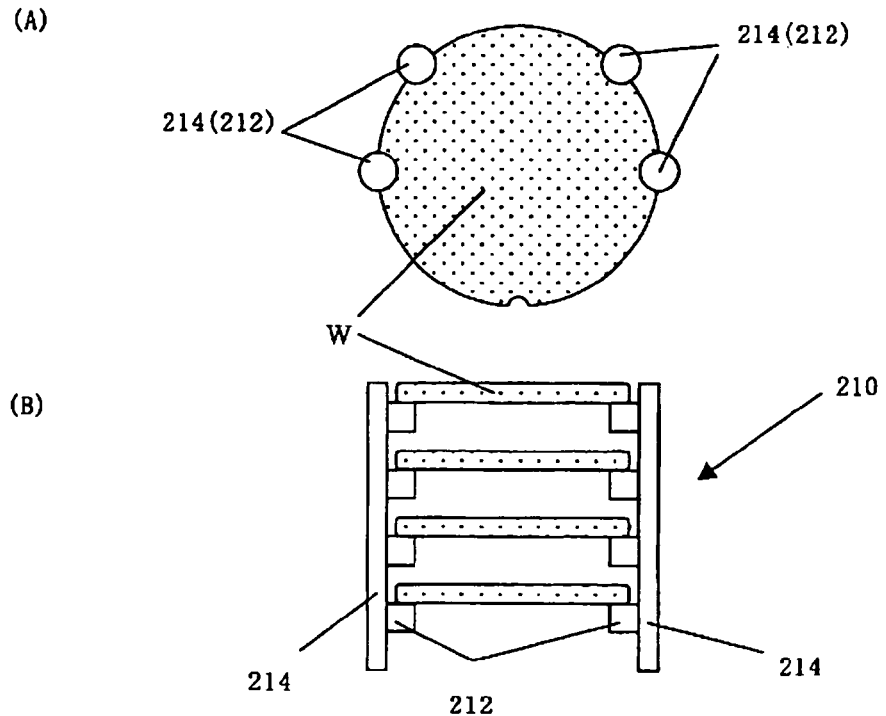
FIG. 9 is an explanatory view showing a state where wafers are set in the conventional vertical heat treatment boat.
Figure 10:
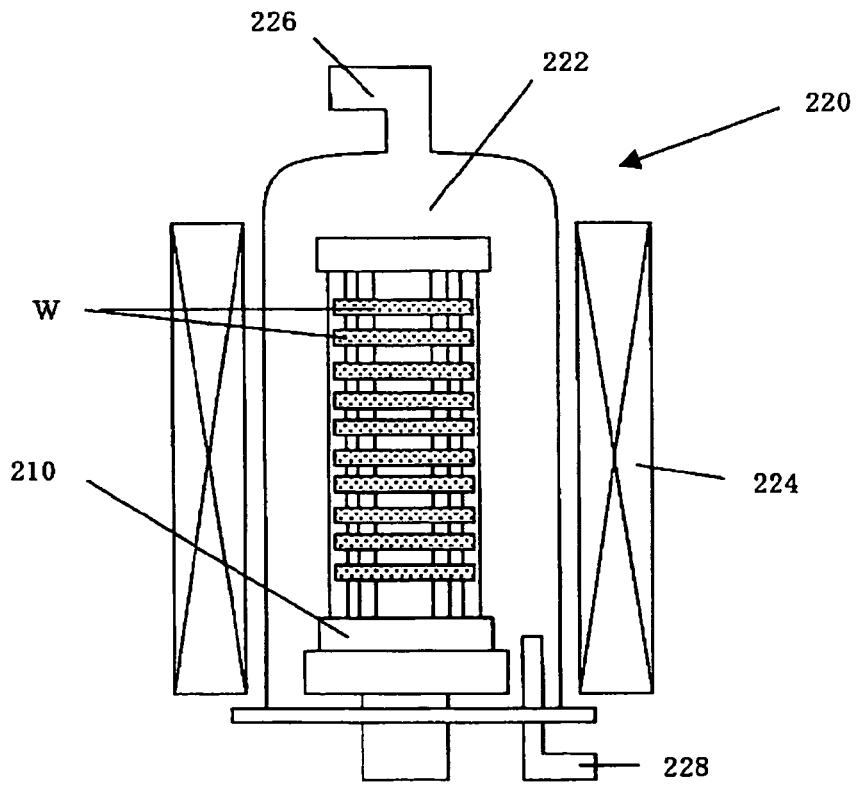
FIG. 10 is a schematic view showing an example of a vertical heat treatment furnace.
Figure 11:
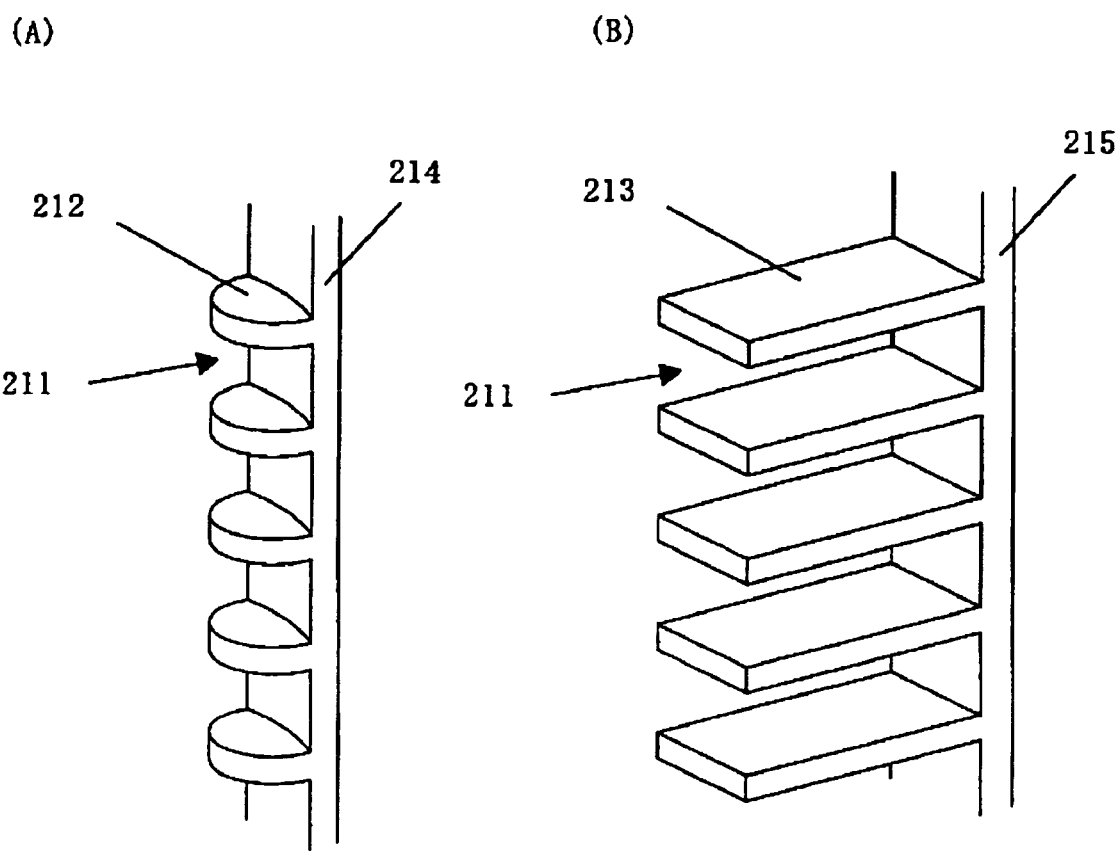
FIG. 11 is a schematic view showing wafer support portions in the conventional vertical heat treatment boat.

As a result, slip dislocation occurred in the heat-treated silicon wafer. FIG. 7 shows an example of a measurement result of slip dislocation in the heat-treated silicon wafer.

It is to be noted that a three-dimensional measuring instrument was used like Example 1 to measure shapes of support portions of the boat, whereby the same measurement result and flatness (60 μm) as those in Table 1 (items of the long finger boat itself) were obtained (see Table 1).

Comparative Example 2

The long finger boat main body that was first prepared in Example, i.e., the same four-point support boat as that in the conventional example was used, the same support auxiliary members having a thickness of 1.00 mm were attached to all the support portions, a silicon wafer having a diameter of 300 mm was mounted on the support auxiliary members, and annealing was carried out at 1200° C. for one hour like Example.

As a result, slip dislocation occurred in the heat-treated silicon wafer like FIG. 7.

It is to be noted that a three-dimensional measuring instrument was used to measure shapes of the support portions of the boat like Example 1, whereby the same measurement result and flatness (60 μm) as those in Table 1 (items of the long finger boat itself) were obtained. Since the thicknesses of the support auxiliary members were all 1.00 mm, relative positions of mounting surfaces of the respective support auxiliary members did not change, and hence the flatness did not change and was 60 μm (see Table 1).

Reference Example

A vertical heat treatment boat according to the present invention was prepared like Example 1 and the heat treatment method according to the present invention was carried out except that a support auxiliary member 3a having a thickness of 1.00 mm was selected and attached to a support portion 2a, a support auxiliary member 3b having a thickness of 1.00 mm to a support portion 2b, a support auxiliary member 3c having a thickness of 1.01 mm to a support portion 2c, and a support auxiliary member 3d having a thickness of 1.00 mm to a support portion 2d, in order for the flatness to be degraded.

At this time, the flatness was degraded to 63 μm from 60 μm as shown in Table 1, and slip dislocation which was more serious than that in FIG. 7 was confirmed in the heat-treated silicon wafer.

As explained above, when the vertical heat treatment boat and the heat treatment method for a semiconductor wafer according to the present invention are used, since the flatness provided by all mounting surfaces of the support auxiliary members on which a processing target substrate is to be mounted is adjusted and then the processing target substrate is mounted to be subjected to a heat treatment, the flatness can be improved and occurrence of slip dislocation can be effectively avoided as can be understood from comparison between Example and Comparative Examples 1 and 2. Furthermore, the adjustment of the flatness can be easily performed at a low cost.

Additionally, it can be understood also from Example and Reference Example that the adjustment of the flatness is important for occurrence of slip dislocation. To avoid the slip dislocation, the support auxiliary members having appropriate thicknesses or the spacers can be selected so as to obtain desired small flatness.

It is to be noted that the present invention is not restricted to the foregoing embodiment. The foregoing embodiment is just an exemplification, and any examples that have substantially the same structures and demonstrate the same functions and effects as those in the technical concept described in claims of the present invention are included in the technical scope of the present invention.

The invention claimed is:

1. A vertical heat treatment boat that has at least four or more support portions per processing target substrate to be supported, the support portions horizontally supporting the processing target substrate, support auxiliary members on which the processing target substrate is mounted being detachably attached to the four or more support portions, respectively,
   wherein flatness obtained from all surfaces of the respective support auxiliary members on which the processing target substrate is mounted is adjusted by
   adjusting thicknesses of the support auxiliary members or interposing spacers between the support portions and the support auxiliary members
   in accordance with respective shapes of the four or more support portions.

2. The vertical heat treatment boat according to claim 1, wherein the vertical heat treatment boat has four or more supports and a pair of plate-like members coupled with both end portions of each support, the plurality of support portions are formed on each support in a vertical direction by forming a plurality of grooves in a horizontal direction, and each processing target substrate is inserted into each groove and supported by the four or more support portions.

3. A heat treatment method for a semiconductor wafer, the method including, at least, when horizontally supporting each semiconductor wafer by four or more support portions and performing a heat treatment, detachably attaching respective support auxiliary members to the four or more support portions, and mounting the semiconductor wafer on the support auxiliary members to be subjected to the heat treatment,
   wherein respective shapes of the four or more support portions are measured to obtain flatness provided by all the four or more support portions from the measurement, based on the obtained flatness,
   thicknesses of the support auxiliary members are adjusted, the support auxiliary members having the adjusted thicknesses are selected in accordance with the measured shapes of the respective support portions, and the selected support auxiliary members are attached to the support portions, or
   spacers are selected in accordance with the measured shapes of the respective support portions, and the support auxiliary members are attached to the support portions to sandwich the selected spacers, and
   the flatness provided by all mounting surfaces of the respective support auxiliary members is adjusted, and then the semiconductor wafer is mounted on the mounting surfaces to be subjected to the heat treatment.

4. The heat treatment method for a semiconductor wafer according to claim 3, wherein the heat treatment is performed by using a vertical heat treatment boat which has four or more supports and a pair of plate-like members coupled with both end portions of each support and in which the plurality of support portions are formed on each support in a vertical direction by forming a plurality of grooves in a horizontal direction and each semiconductor wafer is inserted into each groove and supported by the four or more support portions.

* * * * *